(12) United States Patent
Yang et al.

(10) Patent No.: US 6,693,575 B1
(45) Date of Patent: Feb. 17, 2004

(54) MULTI-CHANNEL BIT-SERIAL ANALOG-TO-DIGITAL CONVERTER WITH REDUCED CHANNEL CIRCUITRY

(75) Inventors: David Xiao Dong Yang, Mountain View, CA (US); William R. Bidermann, Los Gatos, CA (US)

(73) Assignee: Pixim, Inc., Mountain View, CA (US)

( * ) Notice: Subject to any disclaimer, the term of this patent is extended or adjusted under 35 U.S.C. 154(b) by 0 days.

(21) Appl. No.: 10/150,553

(22) Filed: May 17, 2002

Related U.S. Application Data

(63) Continuation-in-part of application No. 09/965,600, filed on Sep. 25, 2001, now Pat. No. 6,518,909, which is a continuation of application No. 09/823,443, filed on Mar. 30, 2001, now Pat. No. 6,310,571.

(51) Int. Cl.[7] .............................................. H03M 1/12
(52) U.S. Cl. ..................... 341/155; 341/161; 341/156; 341/136; 341/159; 348/294; 348/297; 348/227
(58) Field of Search ................................ 341/155, 136, 341/169, 159, 161, 152; 348/294, 297, 311, 230, 227

(56) References Cited

U.S. PATENT DOCUMENTS

| | | | | |
|---|---|---|---|---|
| 4,599,602 A | * | 7/1986 | Matzuzawa et al. | 341/161 |
| 5,037,067 A | * | 8/1991 | Ray | 251/314 |
| 5,126,742 A | * | 6/1992 | Schmidt et al. | 341/156 |
| 5,307,067 A | | 4/1994 | Kimura et al. | 341/159 |
| 5,313,207 A | * | 5/1994 | Kouno et al. | 341/156 |
| 5,461,425 A | * | 10/1995 | Fowler et al. | 348/294 |
| 5,684,419 A | * | 11/1997 | Murden et al. | 341/159 |
| 5,801,657 A | * | 9/1998 | Fowler et al. | 341/155 |
| 6,310,571 B1 | * | 10/2001 | Yang et al. | 341/155 |
| 6,362,767 B1 | * | 3/2002 | Yang et al. | 341/155 |
| 6,518,909 B1 | * | 2/2003 | Yang et al. | 341/155 |

OTHER PUBLICATIONS

Yang, et al. CMOS Image Snesor with Ultra Wide Range Floating Point Level ADC , IEEE Jornal of Solid State Circuit , vol. No 12, Dec. 1999, 1821–1834.*

* cited by examiner

Primary Examiner—Michael Tokar
Assistant Examiner—Lam T. Mai
(74) Attorney, Agent, or Firm—Patent Law Group LLP; Carmen C. Cook

(57) ABSTRACT

A multi-channel bit-serial analog-to-digital converter with reduced channel circuitry is described herein in which a one-bit comparator circuit is split between a first part located within an input channel and a second part located outside the input channel. The external part of the comparator and the one-bit latch are shared by a plurality of input channels. In the preferred embodiment, a two-dimensional sensor array of pixel elements is fabricated in a single integrated circuit. Each of the pixel elements is an input channel which comprises a photodetector and the front-end part of the one-bit comparator. The external part of the comparator and the one-bit latch are formed in the periphery of the sensor array and are shared by a group of pixel elements, such as a column of pixel elements. In one embodiment, by connecting the output of an inverter to the control signal terminal of the comparator, the comparator can also be used as a buffer for analog readout. This creates an analog read port for minimum amount of circuitry increase.

21 Claims, 4 Drawing Sheets

MULTI-CHANNEL BIT-SERIAL ANALOG-TO-DIGITAL CONVERTER WITH REDUCED CHANNEL CIRCUITRY

CROSS-REFERENCE TO RELATED APPLICATIONS

This is a continuation-in-part of U.S. patent application Ser. No. 09/965,600, entitled "Analog-to-Digital Converter with Multiplexed Input Channels," filed on Sep. 25, 2001, by David Xiao Dong Yang and William R. Bidermann, the same inventors of the present application, now U.S. Pat. No. 6,518,909, issued Feb. 11, 2003, which application is incorporated herein by reference in its entirety and which application is a continuation of application Ser. No. 09/823,443, filed Mar. 30, 2001, entitled "Multitplexed Multi-Channel Bit Serial Analog-to-Digital Converter," by David Xiao Dong Yang and William R. Bidermann, now U.S. Pat. No. 6,310,571, issued Oct. 30, 2001.

This application is related to U.S. Pat. Nos. 5,461,425 and 5,801,657 and 6,362,767, each of which is hereby incorporated by reference.

FIELD OF THE INVENTION

The invention relates to an analog-to-digital converter circuit for use in an image sensor chip for converting analog electrical signals into digital signals.

BACKGROUND OF THE INVENTION

An image sensor is used to convert an optical image focused on the sensor into electrical signals. The image sensor typically includes an array of light detecting elements, where each element produces a signal corresponding to the intensity of light impinging on that element when an image is focused on the array. These signals may then be used, for example, to display a corresponding image on a monitor or otherwise used to provide information about the optical image.

One very common type of image sensor is a charge coupled device (CCD). Integrated circuit chips containing a CCD image sensor have a relatively low yield and are expensive due to the specialized processing involved. The CCDs also consume a relatively large amount of power. Other disadvantages exist.

A much less expensive type of image sensor is formed as an integrated circuit using a CMOS process. In such a CMOS type image sensor, a photodiode or phototransistor (or other suitable device) is used as the light-detecting element, where the conductivity of the element corresponds to the intensity of light impinging on the element. The variable signal thus generated by the light detecting element is an analog signal whose magnitude is approximately proportional (within a certain range) to the amount of light impinging on the element.

It is known to form these light-detecting elements in a two-dimensional core array which is addressable by row and column. Once a row of elements has been addressed, the analog signals from each of the light detecting elements in the row are coupled to the respective columns in the array. An analog-to-digital converter (ADC) may then be used to convert the analog signals on the columns to digital signals so as to provide only digital signals at the output of the image sensor chip.

In many digital-imaging applications, it is desirable to integrate analog-to-digital conversion with an area image sensor. U.S. Pat. No. 5,461,425 by B. Fowler et al. discloses a multi-channel bit-serial analog-to-digital converter (MCBS ADC) architecture that is best suited for converting many input channels simultaneously.

In an MCBS ADC, each input channel contains a one-bit comparator and a one-bit latch. The comparator and the latch are controlled by two external control signals RAMP and BITX, respectively. The two control signals are generated by a single micro-control block and a digital-to-analog (D/A) converter, and they are broadcast to all the input channels. The primary advantage of the MCBS ADC is reflected in its unique architecture, wherein all input channels operate simultaneously for maximum throughput and each input channel has very simple circuitry, i.e., a one-bit comparator and a one-bit latch, for minimum area. In such design the more complicated control circuitry is shared among all input channels so that the overhead of the control circuitry is amortized over many input channels. The MCBS ADC makes it possible to implement digitizing systems with a very large number of input channels, such as an image sensor with pixel-parallel ADCs.

It is realized that, however, this circuitry structure (one-bit comparator and a one-bit latch for each input channel) is still not simple enough for some applications. For instance, in an image sensor with pixel-parallel ADCs (also known as a DPS image sensor) each input channel is a pixel, and each pixel has a very limited amount of area. In this case, even a one-bit comparator and a one-bit latch may take too much area to be implemented cost effectively.

What is desired is to reduce further the input channel structure so that the MCBS ADC can be useful in applications with the most stringent area requirement on input channels, e.g. a CMOS image sensor with small pixel size.

SUMMARY OF THE INVENTION

A multi-channel bit-serial analog-to-digital converter architecture with reduced channel circuitry is described herein, in which a one-bit comparator circuit is split between a first part that is associated with each input channel and a second part that is formed external to the input channels. The one-bit latch is also formed external to the input channels. The external part of the comparator and the one-bit latch are shared by a plurality of input channels.

In one embodiment of the invention, a two-dimensional sensor array of pixel elements is fabricated in an integrated circuit. Each of the pixel elements is an input channel which comprises a photodetector and the front-end part of the one-bit comparator. The external part of the comparator and the one-bit latch are built in the periphery of the sensor array and are shared by each column of pixel elements. Because the transistor count in each pixel is dramatically reduced, the area requirement for implementing the pixel elements is hence relaxed.

In another embodiment, by connecting the output of an inverter to the control signal terminal of the comparator, the comparator can be used as a buffer for analog readout. This basically creates an analog read port with a minimum amount of circuitry increase. Sometimes the resulting operational amplifier can be unstable because of the feedback between a comparator's output and the negative terminal of the comparator. This problem is preferably resolved by designing the comparator as an operational amplifier from the beginning and using only the first stage of the comparator for feedback. In such design, a single stage is inherently stable.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE INVENTION

In the following detailed description of the invention, some specific details are set forth to provide a thorough understanding of the presently preferred embodiment of the invention. However, it will be apparent to those skilled in the art that the invention may be practiced in embodiments that do not use the specific details set forth herein. Well known methods, procedures, components, and circuitry have not been described in detail.

Figure 1:
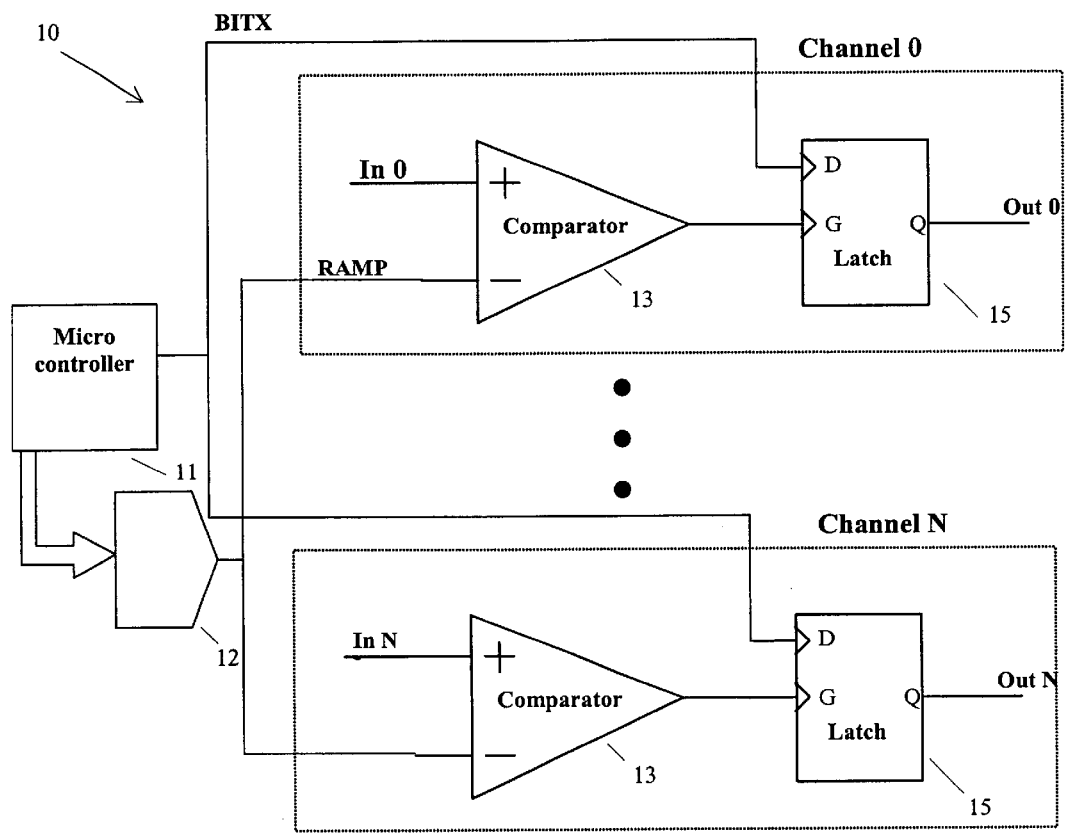
FIG. 1 is a block diagram which shows the basic architecture of an MCBS ADC incorporating global circuitry and circuitry associated with each input channel, where each channel contains a one-bit comparator and a one-bit latch, in accordance with U.S. Pat. No. 5,461,425, entitled "CMOS Image Sensor With Pixel Level A/D Conversion," of Fowler et al.

In the following discussion, in references to the drawings like numerals refer to like parts throughout the several views. FIG. 1 shows a basic architecture of a prior art MCBS ADC, wherein each input channel (Channel 0, Channel 1, ... Channel N) contains a one-bit comparator 13 and a one-bit latch 15. A plurality of identical ADCs are located within a two dimensional array of photodetectors, which is in turn located within an image sensor core on a single integrated circuit chip 10. Each of these ADCs outputs a stream of bits that is representative of the analog input which is in turn representative of the amount light falling upon a corresponding light detecting element connected to each ADC. The shared circuitry between the input channels comprises a microcontroller 11, and a digital-to-analog (D/A) converter 12. The microcontroller 11 may be a state machine, a programmed microprocessor, or any other circuit for generating a series of codes, which generates the BITX signals, selection signals (e.g. Sel 0, Sel 1, ... Sel N), and reset signals, and for controlling the row decoders. This does not necessarily mean that the microcontroller is a standard in the sense of an Intel 8051, PIC, ARM. The D/A converter 12, together with the microcontroller 11, generates the RAMP signals. All input channels operate simultaneously.

Figure 2:
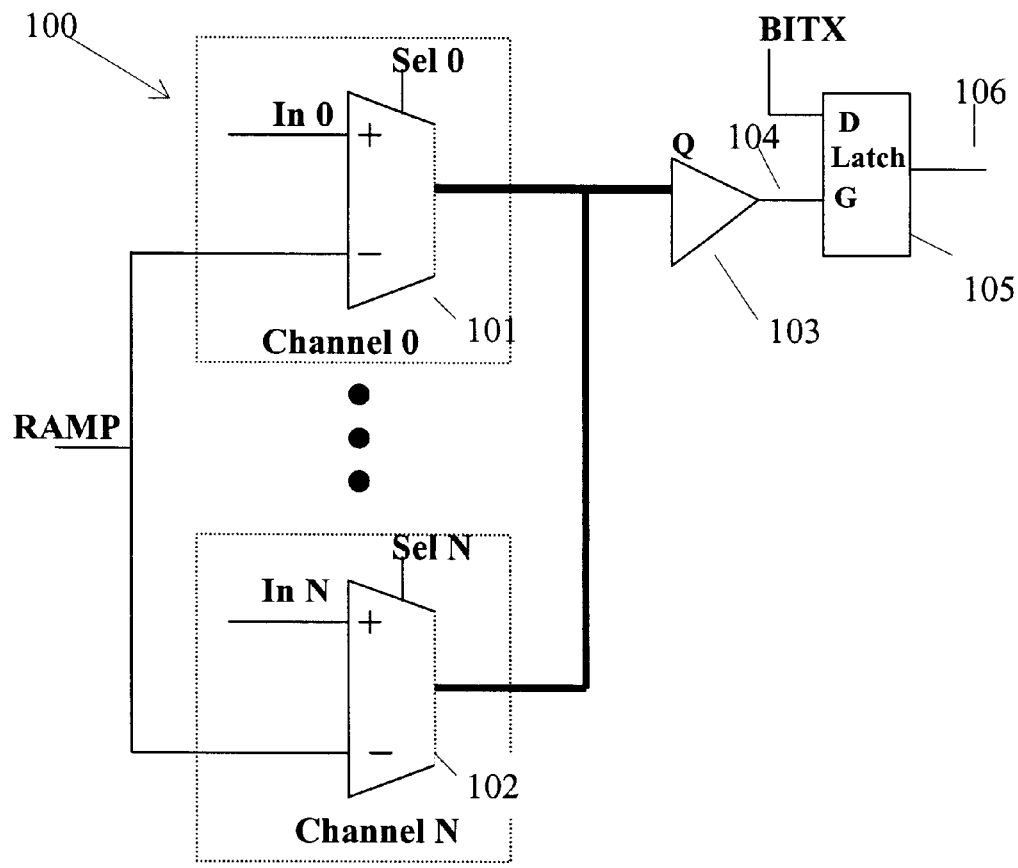
FIG. 2 is a block diagram which shows part of a comparator and a one-bit latch which have been moved outside of each input channel and that are shared by a plurality of input channels according to one embodiment of the present invention.

FIG. 2 illustrates a key aspect of the present invention according to one embodiment thereof, wherein the one-bit comparator's majority part 103 and the one bit latch 105 are built outside of each input channel, and are shared among a plurality of channels. Contrary to the prior art where all input channels operate simultaneously, in the preferred embodiment of the invention the comparator and the one-bit latch are multiplexed among the input channels.

Operation of an MCBS ADC architecture shown in FIG. 2, comprises three processes.

First, the input analog signal (In 0, In 1, ... In N), i.e. the pixel charge signal generated by a photodetector in each pixel channel is sent to the comparator input that is directly connected to the photodetector. The other input of the comparator is connected to control signal RAMP which has a multiple number of levels. In a column of input channels, all comparator inputs receive the input analog signals simultaneously.

Selection signal (Sel 0, Sel 1, ... Sel N) generated by the microcontroller decides which input channel operates in a specific interval. In other words, it decides which input analog signal is to be compared with control signal RAMP. The analog signal in one channel is compared with the RAMP signal when the selection signal is on for that channel. If the value of the pixel charge signal is higher than that of the RAMP signal, the comparator outputs a one; otherwise it outputs a zero. The set of binary comparisons is preferably performed in the order of increasing RAMP value.

The output of the comparator 104 is sent to the G input terminal of the one-bit latch 105 through which the compared signal is transferred to output 106 (digital output terminal) when control signal BITX switches from low to high. The control signal BITX from the microcontroller (11, FIG. 1) is a global clock signal connected to the data input terminal D of the latch 105. When the signal 104 is high, the output 106 follows the BITX signal. When the signal 104 is low, the latch 105 remains its previous state.

The technique used to convert the analog signal to a string of bits whose average roughly equals the average of the analog signal is generally known as Sigma-Delta modulation. The description of Sigma-Delta modulation in U.S. Pat. No. 5,461,425 is incorporated herein by reference and will not be repeated here.

The application of a Gray code for N-bit A/D conversion is preferred here and is described in U.S. Pat. No. 5,801,657, which is incorporated herein by reference and will not be repeated here. The preferred embodiment of the invention performs $2^n-1$ comparisons to generate the N-Bit Digital code, where N is greater than or equal to 3.

Figure 3:
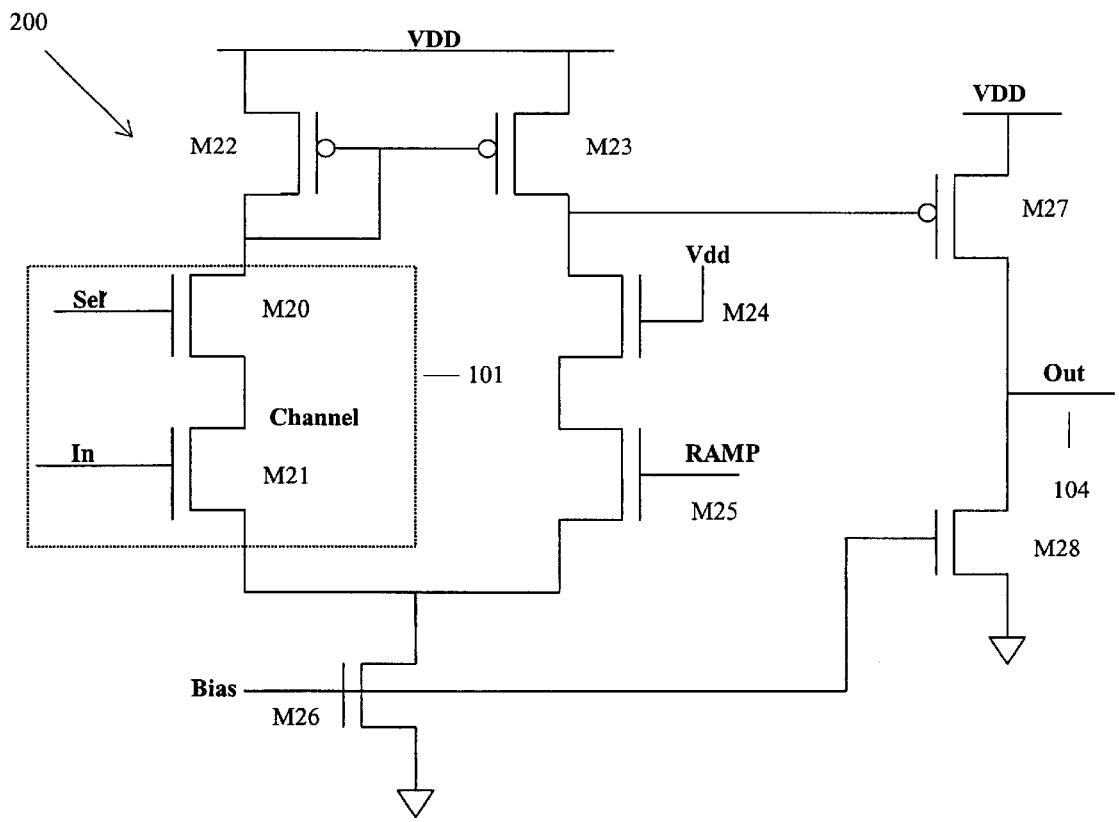
FIG. 3 is a schematic diagram which shows a one-bit comparator circuit which is split between an input channel and the periphery area according to one embodiment of the present invention.

FIG. 3 illustrates one embodiment of the present invention where a one-bit comparator circuit 200 is split between a front-end part within an input channel and the rest outside the input channel. The comparator is comprised of a differential amplifier and an inverter. The inverter is comprised of a PMOS transistor M27 and a NMOS transistor M28, the rest is the differential amplifier. A conventional differential amplifier does not have NMOS transistors M20 and M24. M20 is added to turn the channel on and off, M24 is added to make both sides of the differential amplifier symmetric. Because the gate of M24 is connected to the voltage supply (Vdd), M24 is always on. M20 is on when the selection signal is high, and it is off when the selection signal is low. NMOS transistors M21 and M25 are the input gates of the differential amplifier. NMOS transistor M26 is a current source that supplies a constant current whose magnitude is controlled by the bias voltage and is independent of the input signal. PMOS transistors M22 and M23 form a current mirror and serve as a load to the differential amplifier. The current flow through M22 and M23 is equal. This comparator 200 uses only nine transistors. Only the front part of the comparator, i.e. transistors M20 and M21, stay within the pixel channel. The rest of the circuit, comprising seven transistors M22–M28, is built in the periphery of the sensor array and may be shared by a group of neighboring pixels, such as a column of pixel channels. The transistor count in each pixel channel is reduced to two (M20 and M21), and therefore the area requirement is relaxed. Thus, a multi-bit latch can be implemented in this scheme.

Figure 4:
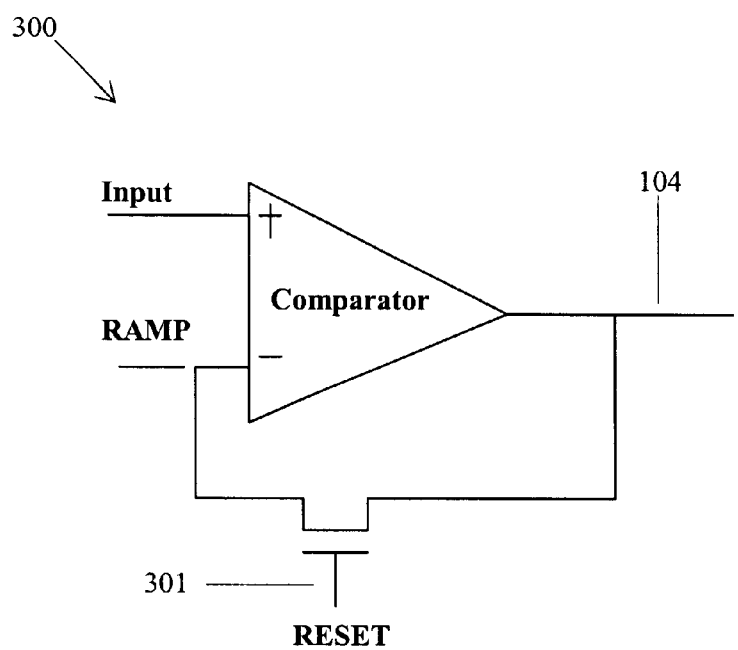
FIG. 4 is a block diagram which shows the comparator operated as a buffer for analog readout according to one embodiment of the present invention.

FIG. 4 shows the comparator working as a buffer 300 for analog readout. The output terminal 104 of comparator 103 is connected back to the RAMP terminal of the comparator via a RESET switch 301. In one embodiment, a MOSFET is used as RESET switch 301. The MOSFET is an NFET transistor, which needs high voltage to turn it on. When RESET switch 301 is high, the negative input terminal of comparator 103 is connected in a feedback loop with the output terminal of the comparator, effectively disabling the RAMP signal at the negative input terminal. Thus, the comparator acts as a buffer. When RESET switch 301 is low, the RAMP signal is coupled to the negative input terminal and the comparator is in comparison mode.

The advantages and benefits provided by the MCBS ADC architecture 100 in FIG. 2 are numerous. Some examples of the advantages and benefits are described below.

First, because part of the comparator and the one-bit latch are shared and multiplexed among a group of input channels, the total circuitry for the MCBS ADC's is simplified. Such simplification helps lower systems cost and power consumption.

Second, because each input channel contains only part of the comparator, the area requirement for each pixel is relaxed, more pixels can be implemented in a single photosensitive chip, and thus a higher resolution of digital images can be obtained. Because each channel is controlled by the selection signal, the output signal of the comparator for each channel comes to the latch sequentially, and the whole structure functions as a multiplexer. No extra multiplexer is needed to convert the parallel input data to series output data. This further reduces pixel level circuitry.

Lastly, because the latches are moved to the periphery of the sensor array and more area is available, this ADC does not have to be bit-serial. In fact, it can be made to work as a single slope ADC, where the output of each comparator drives N-bit latches.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claim. Accordingly, the scope of the present invention is defined by the appended claims rather than the forgoing description of embodiments.

We claim:

1. An analog-to-digital converter circuit, comprising:
   a first signal generator for generating a first signal having a plurality of levels;
   a comparator, wherein a first part of said comparator is formed within each of a plurality of input channels that generate analog input signals and a remaining part of said comparator is formed external to said input channels and is shared by said input channels, wherein said comparator is controlled by a selection signal as to which analog input signal is to be compared with said first signal;
   a binary signal generator for generating a series of binary signals; and
   a one-bit latch having a first input coupled to receive an output of said comparator, said latch having a data input coupled to receive said binary signals, an output of said comparator controlling when said latch provides an output signal corresponding to a binary signal applied to said data input, wherein said latch is formed external to said input channels and is shared by said input channels;
   wherein said latch provides at least a portion of an N-bit digital code representing said analog input applied to said comparator.

2. The circuit of claim 1, wherein each of said input channels is a pixel element in an image sensor.

3. The circuit of claim 2, wherein said image sensor is a CMOS image sensor.

4. The circuit of claim 1, wherein said comparator comprises a differential amplifier, and wherein both sides of said differential amplifier are symmetric.

5. The circuit of claim 4, wherein said differential amplifier in each of said input channels, in corresponding to said selection signal, functions as a multiplexer.

6. The circuit of claim 4, wherein said differential amplifier comprises an NMOS transistor as current source that supplies a constant current whose magnitude is controlled by a bias voltage and is independent of said analog input signal.

7. The circuit of claim 4, wherein said differential amplifier comprises two PMOS transistors forming a current mirror and serving as a load to said differential amplifier, wherein current flow through said two PMOS transistors is equal.

8. The circuit of claim 1, wherein said comparator comprises an inverter that is formed external to said input channels.

9. The circuit of claim 8, wherein said inverter comprises a PMOS transistor and an NMOS transistor.

10. The circuit of claim 1, wherein each of said input channels comprises a control device controlled by said selection signal, said control device operating to turn said channel on or off.

11. The circuit of claim 10, wherein said control device is an NMOS transistor.

12. The circuit of claim 1, wherein an output of an inverter is connected back to said first signal terminal of said comparator via a reset switch wherein said comparator is a buffer for analog readout.

13. The circuit of claim 12, wherein said reset switch is a MOSFET transistor.

14. The circuit of claim 1, wherein said comparator is an operational amplifier and the first stage of said comparator is used for feedback.

15. The circuit of claim 1, wherein said N-bit digital code is a Gray code.

16. The circuit of claim 1, wherein said comparator performs 2N−1 comparisons to generate said N-bit digital code.

17. The circuit of claim 1, wherein N is greater than or equal to 3.

18. A method for converting electrical signals representing an optical image into binary signals, said method comprising:
   receiving a first signal having a plurality of levels;
   comparing said first signal to an analog input signal to be converted into digital value and outputting a comparison result, wherein said analog input signal is sequentially selected from N analog input signals by a selection signal, wherein each of said analog input signals is generated by each of a plurality of input channels respectively;
   receiving a series of binary signals; and
   applying said comparison result to a first input of a latch, and applying said series of binary signals to a data input of said latch, wherein a logic level of said comparison result controlling when said latch provides an output signal corresponding to a binary signal applied to said data input, and wherein said latch provides at least a portion of an N-bit digital code representing said analog input signal.

19. The method of claim 18, wherein said comparison result is sent back to said first signal terminal of said comparator via a reset switch and said comparator is used as a buffer for analog readout, and wherein when said reset switch is high said first signal is disabled from said comparator and when said reset switch is low said first signal is coupled from said comparator.

20. The method of claim 18, wherein said N-bit digital code is a Gray code.

21. The method of claim 18, wherein 2N−1 comparisons are performed to generate said N-bit digital code.

* * * * *